US012641822B2

(12) United States Patent　　(10) Patent No.:　US 12,641,822 B2
Lichtenwalner et al.　　　　　　(45) Date of Patent:　May 26, 2026

(54) POWER DEVICES WITH A HYBRID GATE STRUCTURE

(71) Applicant: Wolfspeed, Inc., Durham, NC (US)

(72) Inventors: Daniel Jenner Lichtenwalner, Raleigh, NC (US); Naeem Islam, Morrisville, NC (US)

(73) Assignee: Wolfspeed, Inc., Durham, NC (US)

( * ) Notice: Subject to any disclaimer, the term of this patent is extended or adjusted under 35 U.S.C. 154(b) by 147 days.

(21) Appl. No.: 16/907,163

(22) Filed: Jun. 19, 2020

(65) Prior Publication Data

US 2021/0399128 A1　　Dec. 23, 2021

(51) Int. Cl.
　　　*H10D 30/66*　　　(2025.01)
　　　*H10D 30/01*　　　(2025.01)
　　　*H10D 64/27*　　　(2025.01)
(52) U.S. Cl.
　　　CPC ....... *H10D 30/668* (2025.01); *H10D 30/0297* (2025.01); *H10D 64/513* (2025.01)
(58) Field of Classification Search
　　　CPC ............. H01L 29/7813; H01L 29/1095; H01L 29/7397; H10D 62/393; H10D 30/668; H10D 62/8325; H10D 30/0297; H10D 62/157
　　　See application file for complete search history.

(56) References Cited

U.S. PATENT DOCUMENTS 5,382,541 A　　1/1995　Bajor et al.
6,573,534 B1　　6/2003　Kumar et al.

9,111,919 B2　　8/2015　Lichtenwalner et al.
9,570,570 B2　　2/2017　Lichtenwalner et al.
2001/0026961 A1　10/2001　Williams et al.
　　　　　　(Continued)

FOREIGN PATENT DOCUMENTS

CN　　　　1540770 A　　10/2004
EP　　　　1981076 A1　　10/2008
　　　　　(Continued)

OTHER PUBLICATIONS

Bhat, Navakanta et al., "Charge Trap Generation in LPCVD Oxides Under High Field Stressing," IEEE Transactions on Electron Devices, vol. 43, No. 4, Apr. 1995, pp. 554-560.

(Continued)

*Primary Examiner* — Samuel A Gebremariam
*Assistant Examiner* — Jonas T Beardsley
(74) *Attorney, Agent, or Firm* — Myers Bigel, P.A.

(57)　　　　　ABSTRACT

A vertical field effect device having a body, gate dielectric, and a gate electrode, which is in a trench that extends into the body from the top surface of the body and is located between first and second source regions. The first and second regions vertically overlap the gate electrode. The first and second channel regions laterally overlap a bottom of the gate electrode, such that each channel formed in the first and second source regions have a horizontal segment where the first and second channel regions laterally overlap the bottom of the gate electrode. In another embodiment, the first and second channel regions also vertically overlap the gate electrode such that each channel formed in the first and second source regions also have a vertical segment where the first and second channel regions vertically overlap the gate electrode.

22 Claims, 5 Drawing Sheets

(56) References Cited

U.S. PATENT DOCUMENTS

| | | | |
|---|---|---|---|
| 2002/0038891 A1 | 4/2002 | Ryu et al. | |
| 2004/0079989 A1 | 4/2004 | Kaneko et al. | |
| 2004/0119076 A1 | 6/2004 | Ryu | |
| 2004/0142523 A1 | 7/2004 | Bencuya et al. | |
| 2004/0211980 A1 | 10/2004 | Ryu | |
| 2006/0118818 A1 | 6/2006 | Shimoida et al. | |
| 2007/0057262 A1 | 3/2007 | Nakamura et al. | |
| 2008/0105949 A1 | 5/2008 | Zhang et al. | |
| 2008/0230787 A1* | 9/2008 | Suzuki | H01L 29/7813 |
| | | | 257/E29.066 |
| 2009/0142899 A1 | 6/2009 | Jensen et al. | |
| 2009/0189228 A1 | 7/2009 | Zhang et al. | |
| 2010/0301335 A1 | 12/2010 | Ryu et al. | |
| 2011/0147764 A1 | 6/2011 | Dhar et al. | |
| 2011/0291185 A1 | 12/2011 | Grover | |
| 2012/0009801 A1 | 1/2012 | Tanioka et al. | |
| 2012/0223330 A1 | 9/2012 | Dhar et al. | |
| 2012/0248462 A1 | 10/2012 | Wada et al. | |
| 2012/0286291 A1 | 11/2012 | Hiyoshi et al. | |
| 2012/0326163 A1 | 12/2012 | Dhar et al. | |
| 2012/0326207 A1 | 12/2012 | Yoshimochi | |
| 2012/0329216 A1 | 12/2012 | Dhar et al. | |
| 2013/0078771 A1 | 3/2013 | Hiyoshi et al. | |
| 2013/0119407 A1 | 5/2013 | Masuda et al. | |
| 2013/0146969 A1 | 6/2013 | Fujiwara et al. | |
| 2013/0234161 A1 | 9/2013 | Shimizu et al. | |
| 2013/0240906 A1 | 9/2013 | Shimizu et al. | |
| 2014/0008666 A1 | 1/2014 | Harada et al. | |
| 2014/0332869 A1 | 11/2014 | Ezaki et al. | |
| 2015/0097226 A1* | 4/2015 | Lichtenwalner | H01L 29/7802 |
| | | | 257/329 |
| 2015/0318389 A1* | 11/2015 | Tsuchiya | H01L 29/66068 |
| | | | 257/77 |
| 2016/0079413 A1* | 3/2016 | Kono | H01L 29/1095 |
| | | | 438/270 |
| 2017/0012119 A1* | 1/2017 | Konstantinov | H01L 21/049 |
| 2017/0110534 A1* | 4/2017 | Shiomi | H01L 29/1608 |
| 2021/0005744 A1* | 1/2021 | Ebihara | H01L 29/1095 |
| 2021/0143273 A1* | 5/2021 | Saitoh | H01L 29/7811 |

FOREIGN PATENT DOCUMENTS

| | | | |
|---|---|---|---|
| EP | 2242107 A1 | 10/2010 | |
| JP | H04045533 A | 2/1992 | |
| JP | H09074191 A | 3/1997 | |
| JP | 2000312003 A | 11/2000 | |
| JP | 2016058679 A | 4/2016 | |
| JP | 2018010995 A | 1/2018 | |
| JP | 2019121705 A | 7/2019 | |
| WO | 2010110246 A1 | 9/2010 | |
| WO | 2011111627 A1 | 9/2011 | |
| WO | 2014103000 A1 | 7/2014 | |

OTHER PUBLICATIONS

Blanc, C. et al., "Process Optimisation for <11-20> 4H-SiC MOSFET Application," Materials Science Forum, vols. 527-529, Oct. 2006, pp. 1051-1054.

Endo, Takeshi et al., "High Channel Mobility of MOSFET Fabricated on 4H—SiC (11-20) Face Using Wet Annealing," Materials Science Forum, vols. 600-603, Sep. 2009, pp. 691-694.

Heer, D. et al., "Switching performance of a 1200 V SiC-Trench-MOSFET in a low-power module," PCIM Europe, May 10-12, 2016, Nuremberg, Germany, VDE VERLAG GMBH, 7 pages.

Lichtenwalner, D. et al., "Performance and Reliability of SiC Power MOSFETs," MRS Advances, vol. 1, Issue 2, Jan. 2016, Materials Research Society, pp. 81-89.

Nanen, Yuichiro et al., "Effects of Nitridation on 4H—SiC MOSFETs Fabricated on Various Crystal Faces," IEEE Transactions on Electron Devices, vol. 60, No. 3, Mar. 2013, pp. 1260-1262.

Okamoto, Dai et al., "Removal of Near-Interface Traps at SiO2/4H—SiC (0001) Interfaces by Phosphorus Incorporation," vol. 96, Applied Physics Letters, 2010, pp. 203508-1-203508-3 (3 pages).

Senzaki, Junji et al., "Effective Normal Field Dependence of Inversion Channel Mobility in 4H—SiC MOSFETs on the (1120) Face," Materials Science Forum, vols. 433-436, Sep. 2003, pp. 613-616.

Yano, H. et al., "Increased Channel Mobility in 4H—SiC UMOSFETs Using On-Axis Substrates," Materials Science Forum, vols. 556-557, Sep. 2007, pp. 807-810.

Yano, Hiroshi et al., "A Cause for Highly Improved Channel Mobility of 4H—SiC Metal-Oxide-Semiconductor Field-Effect Transistors on the (110) Face," Applied Physics Letters, vol. 78, No. 3, Jan. 15, 2001, pp. 374-376.

Yano, Hiroshi et al., "High Channel Mobility in Inversion Layers of 4H—SiC MOSFET's by Utilizing (1120) Face," IEEE Electron Device Letters, vol. 20, No. 12, Dec. 1999, pp. 611-613.

International Search Report and Written Opinion for International Patent Application No. PCT/US2021/037522, mailed Oct. 1, 2021, 15 pages.

* cited by examiner

CURRENT FLOW FROM
SOURCE REGION 24
TOWARD DRAIN CONTACT 34

LL$_G$     LATERAL GATE LENGTH

GOL     GATE-SOURCE OVERLAP

- - - - →   CURRENT FLOW FROM SOURCE REGION 24 TOWARD DRAIN CONTACT 34

$LL_G$   LATERAL GATE LENGTH

GOL   GATE-SOURCE OVERLAP

- - - - -▶   CURRENT FLOW FROM
              SOURCE REGION 24
              TOWARD DRAIN CONTACT 34

V + LL$_G$    VERTICAL AND
              LATERAL GATE LENGTH

GOL           GATE-SOURCE OVERLAP

----- CURRENT FLOW FROM SOURCE REGION 24 TOWARD DRAIN CONTACT 34

V + LL$_G$    VERTICAL AND LATERAL GATE LENGTH

GOL    GATE-SOURCE OVERLAP

POWER DEVICES WITH A HYBRID GATE STRUCTURE

FIELD OF THE DISCLOSURE

The present disclosure relates to vertically oriented power devices.

BACKGROUND

A power metal-oxide-semiconductor field-effect transistor (MOSFET) is a type of MOSFET that is adapted for use in high power applications. Generally, a power MOSFET has a vertical structure, wherein a source and gate contact are located on a top surface of the body of the MOSFET, and the drain contact is located on a bottom surface of the body of the MOSFET. These "vertical" MOSFETs are sometimes referred to as vertical diffused MOSFETs (VDMOSFETs) or double-diffused MOSFETs (DMOSFETs). Such power devices are capable of blocking at least 300 volts in an off-state and conducting at least one ampere in an on-state in typical applications. Generally, the higher the blocking voltage, the lower the current handling, and vice versa, for a given device area.

A conventional vertical MOSFET generally includes a substrate and a drift layer formed over the substrate in a lower portion of the body. One or more junction implants extend into the body from the top surface of the body. A junction gate field effect transistor (JFET) region is provided between the junction implants in the upper portion of the body. Each one of the junction implants is formed by an ion implantation process and will include at least a source region. Each source region is formed in a shallow portion beneath the top surface of the drift layer. The gate structure generally takes on one of a planar or trenched configuration. In planar devices, a gate dielectric is formed along the top surface of the body and extends laterally over at least a portion of each source region. A planar gate electrode is formed over the gate dielectric. In trenched devices, the gate dielectric and gate electrode are provided in a trench that extends into the top surface of the body and between the source regions. Source contacts are formed over the source regions, and a drain contact is formed on the bottom surface of the substrate.

The long term reliability of the vertical MOSFET is often a function of the integrity of the interface between the JFET region and the gate dielectric. Further, this interface dictates the MOSFET's gate-to-drain capacitance, which directly affects switching speeds; gate leakage currents in both the on and off states; and blocking voltages in the off state.

SUMMARY

The present disclosure provides a vertical field effect device having a body, gate dielectric, and a gate electrode. The body has a first source region and a second source region that extend into the body from a top surface of the body. A first channel region is below and laterally overlaps the first source region. A second channel region is below and laterally overlaps the second source region. A JFET region is provided between the first channel region and the second channel region. The gate electrode is in a trench that extends into the body from the top surface of the body and is located between the first source region and the second source region. A gate dielectric is between and isolates the gate electrode from the body. The first source region and the second source region vertically overlap the gate electrode. The first channel region and the second channel region laterally overlap a bottom of the gate electrode. Each channel formed in the first and second channel regions between the JFET region and the first and second source regions has a horizontal segment where the first and second channel regions laterally overlap the bottom of the gate electrode.

In one embodiment, the first and second channel regions do not vertically overlap the gate electrode. The body may also have a first shielding region below and laterally overlapping the first channel region, and a second shielding region below and laterally overlapping the second channel region, such that the JFET region further resides between the first shielding region and the second shielding region. The first and second channel regions may be closer to one another than the first and second shielding regions, such that a portion of the JFET region between the first and second channel regions is narrower than a portion of the JFET region between the first and second shielding regions.

In another embodiment, the first and second channel regions vertically overlap the gate electrode such that each channel formed in the first and second channel regions between the JFET region and the first and second source regions also have a vertical segment where the first and second channel regions vertically overlap the gate electrode.

In one variant, no portion of the gate electrode laterally overlaps the first and second source regions. The body may also have a first shielding region below and laterally overlapping the first channel region, and a second shielding region below and laterally overlapping the second channel region, such that the JFET region further resides between the first shielding region and the second shielding region. The first and second channel regions may be closer to one another than the first and second shielding regions, such that a portion of the JFET region between the first and second channel regions is narrower than a portion of the JFET region between the first and second shielding regions.

In any of the embodiments, the first and second source regions may be doped with an N-type material, and the first and second channel regions may be doped with a P-type material. The field effect device may a metal oxide semiconductor field effect device (MOSFET), an insulated gate bipolar transistor (IGBT), or the like.

In certain embodiments, the trench has a depth, as measured from the top surface of the body to a bottom of the trench, between 0.25 um and 1.0 um, 0.5 um and 1.25 um, 0.5 um and 1.5 um, and 0.75 um and 1.5 um. The body may further include a first shielding region below and laterally overlapping the first channel region, and a second shielding region below and laterally overlapping the second channel region, such that the first and second shielding regions are less than two micrometers deeper than the bottom of the trench.

In certain embodiments, the field effect device can block at least 300 volts, 600 volts, 900 volts, 1200 volts, 1700 volts, 2200 volts, 3500 volts, 6500 volts, or 10,000 volts in an off-state and conduct at least 1 ampere, 5 amperes, 10 amperes, 20 amperes, 50 amperes, or 100 amperes in an on-state.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
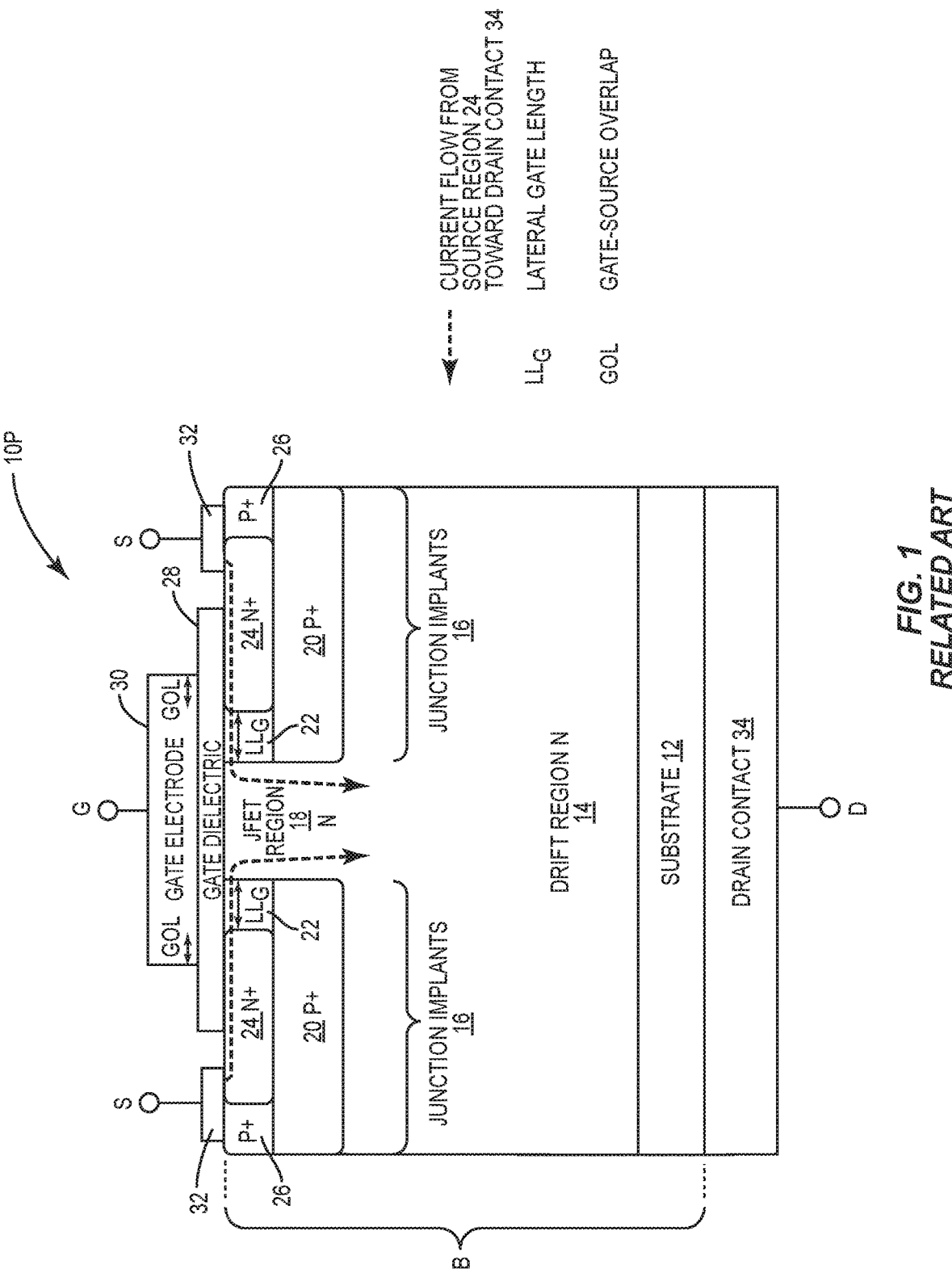
FIG. 1 is a cross-section of a vertical MOSFET that has a planar gate structure, according to related art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In general, the present disclosure provides a vertical field effect device having a body, gate dielectric, and a gate electrode. The body has a first source region and a second source region that extend into the body from a top surface of the body. A first channel region is below and laterally overlaps the first source region. A second channel region is below and laterally overlaps the second source region. A JFET region is provided between the first channel region and the second channel region. The gate electrode is in a trench that extends into the body from the top surface of the body and is located between the first source region and the second source region. A gate dielectric is between and isolates the gate electrode from the body.

The first source region and the second source region vertically overlap the gate electrode. The first channel region and the second channel region laterally overlap a bottom of the gate electrode. As such, each channel formed in the first and second source regions between the JFET region and the first and second source regions has a horizontal segment where the first and second channel regions laterally overlap the bottom of the gate electrode.

In one embodiment, the first and second channel regions do not vertically overlap the gate electrode. The body may also have a first shielding region below and laterally overlapping the first channel region, and a second shielding region below and laterally overlapping the second channel region, such that the JFET region further resides between the first shielding region and the second shielding region. The first and second channel regions may be closer to one another than the first and second shielding regions, such that a portion of the JFET region between the first and second channel regions is narrower than a portion of the JFET region between the first and second shielding regions.

In another embodiment, the first and second channel regions vertically overlap the gate electrode such that each channel formed in the first and second source regions between the JFET region and the first and second source regions also have a vertical segment where the first and second channel regions vertically overlap the gate electrode. In one variant, no portion of the gate electrode laterally overlaps the first and second source regions. Prior to delving into the details of the disclosure concepts, an overview of certain related art is provided.

FIG. 1 shows a conventional planar MOSFET 10P. The planar MOSFET 10P has body B that includes a substrate 12 and a drift region 14 formed on the substrate 12. One or more junction implants 16 extend into the body B from a top surface of the body B, wherein the top surface is opposite the substrate 12. A junction gate field effect transistor (JFET) region 18 is provided between the junction implants 16.

Each one of the junction implants 16 is formed by an ion implantation process, and typically includes a shielding region 20, a channel region 22, a source region 24, and a connector region 26.

The source regions 24 are provided in the top of the body B on either side of the JFET region 18. Each channel region 22 resides between a corresponding source region 24 and the JFET region 18. Each shielding region 20 has a portion that resides below the corresponding channel region 22, source region 24, and connector region 26. Each connector region 26 is on the outside of or laterally adjacent to a corresponding source region 24 and extends between the top surface of the drift region 14 and a corresponding shielding region 20. In the illustrated example, the shielding region 20 extends from the JFET region 18, along a bottom portion of the channel region 22 and source region 24, and upwards toward the top surface of the drift region 14 along an outside portion of the source region 24. As such, each channel region 22 is bound by the top surface of the drift region 14, the JFET region 18, the shielding region 20, and the source region 24.

In a typical configuration, the drift region 14 and JFET region 18 are moderately doped with an N-type doping material (N) at concentrations between about $1 \times 10^{14}$ cm$^{-3}$ and $1 \times 10^{18}$ cm$^{-3}$. The shielding regions 20 are heavily doped with a P-type doping material (P+) at concentrations between about $1 \times 10^{17}$ cm$^{-3}$ and $5 \times 10^{19}$ cm$^{-3}$. The channel regions 22 are moderately doped with a P-type doping material (P) at concentrations between about $1 \times 10^{15}$ cm$^{-3}$ and $1 \times 10^{18}$ cm$^{-3}$. The source regions 24 are heavily doped with an N-type doping material (N+) at concentrations between about $1 \times 10^{18}$ cm$^{-3}$ and $1 \times 10^{21}$ cm$^{-3}$. The connector regions 26 are heavily doped with a P-type doping material at concentrations between about concentrations between about $1 \times 10^{18}$ cm$^{-3}$ and $1 \times 10^{21}$ cm$^{-3}$. The concentration levels are merely exemplary and will vary from embodiment to embodiment depending on the performance criteria of the device.

The substrate 12 may be an N-doped, single crystal, SiC substrate 12. The substrate 12 may have various crystalline polytypes, such as 2H, 4H, 6H, 3C and the like. In other embodiments, the substrate 12 may also be formed from other material systems, such as gallium nitride (GaN), gallium arsenide (GaAs), silicon (Si), germanium (Ge), SiGe, and the like. The substrate 12 may be heavily doped with an N-type dopant at concentrations of between about $1 \times 10^{17}$ cm$^{-3}$ and $1 \times 10^{19}$ cm$^{-3}$ and have a thickness of between about 100 microns and 600 microns; however, the doping concentrations and thicknesses of the substrate 12 and the other layers may vary based on the desired parameters of the MOSFET 10P.

The drift region 14 may be relatively uniformly doped throughout or may employ graded doping throughout all or a portion thereof. For a uniformly doped drift region 14, the doping concentration may be between about $1 \times 10^{14}$ cm$^{-3}$ and $2 \times 10^{16}$ cm$^{-3}$ in one embodiment, depending to the voltage rating of the device. For example, the drift region 14 for a device with a voltage rating of over 10,000 volts may have a doping concentration around $1 \times 10^{14}$ cm$^{-3}$ and be 100 microns or so thick, while a device with a voltage rating of 650 volts may have a doping concentration around $1 \times 10^{14}$ cm$^{-3}$ and be around six microns or so thick.

If the doping concentration in the drift region 14 is graded, the drift region 14 may have a maximum doping of $1 \times 10^{18}$ cm$^{-3}$ at the bottom, and decrease down to the level needed for the device rating near the top. The more highly doped regions would generally be much thinner than the lower doped drift regions. In other embodiments, the doping concentrations may increase in the drift region 14 from the bottom to the top of the drift region 14.

The drift region 14 may include one or more portions. If multiple portions are provided, the upper portion may represent a spreading layer and the lower portion may represent a drift layer. In embodiments that include an upper spreading layer or layers and a lower drift layer or layers, the spreading layer is provided just above the drift layer to help further diminish the electrical fields and facilitate the spreading of the current as it flows downward toward the drift layer(s) and the drain contact 34. The spreading layer is doped in such a way as to decrease resistance in the current path. Use of a spreading layer decreases the ON resistance of the device, wherein a decreased ON resistance can lead to a higher efficiency device.

In certain embodiments, a spreading layer may have a doping concentration between $1 \times 10^{16}$ cm$^{-3}$ and $4 \times 10^{16}$ cm$^{-3}$ and be approximately one micrometer to three micrometers thick. The doping concentrations in the spreading layer(s) may be uniform or graded, wherein the relative action doping concentrations may increase or decrease from the bottom to the top of the spreading layer(s) depending on the desired characteristics of the device. A uniformly or graded doped drift layer may be paired with a uniformly or graded spreading layer. Any of the following embodiments described herein may be configured with spreading and drift layers in the drift regions 14.

A gate dielectric 28 is formed along the top surface of the body B and extends laterally between each source region 24, such that portions of the gate dielectric 28 extend over the channel regions 22 and at least a portion of the source regions 24. A gate (G) electrode 30 is formed over the gate dielectric 28. The planar nature of the gate dielectric 28 and the gate electrode 30 lends the planar MOSFET 10P its name.

Source (S) contacts 32 are formed on the top surface of the drift region 14 and over the source regions 24, such that each one of the source contacts 32 partially overlaps corresponding portions of both the source region 24 and the connector region 26 without contacting the gate dielectric 28 or the gate electrode 30. A drain (D) contact 34 is located on the bottom surface of the substrate 12 opposite the drift region 14.

In operation, when a biasing voltage is not applied to the gate electrode 30 and the drain contact 34 is positively biased, the P-N junction between each shielding region 20 and the drift region 14 is reverse biased, thereby placing the planar MOSFET 10P in an OFF state. In the OFF state of the planar MOSFET 10P, any voltage between the source contacts 32 and drain contact 34 is supported by the drift region 14, and only leakage currents will flow between these contacts. Due to the vertical structure of the planar MOSFET 10P, large voltages may be placed between the source contacts 32 and the drain contact 34 without damaging the device.

When a positive bias is applied to the gate electrode 30 of the planar MOSFET 10P, a lateral channel is formed in each channel region 22 just below the top surface of the drift region 14 underneath the gate electrode 30, thereby placing the planar MOSFET 10P in an ON state. In the ON state, current (shown by the dashed lines) flows laterally through a lateral channel provided in each channel region 22 from the respective source regions 24, via the source contacts 32, into the JFET region 18 of the drift region 14. Notably, current flows predominantly laterally through portions of the source regions 24.

Once in the JFET region 18, the current flows downward through the drift region 14 toward the drain contact 34. An electric field presented at the P-N junctions formed between the shielding regions 20, the channel regions 22, and the drift region 14 tends to force the current to flow through the middle of the JFET region 18. The middle of the JFET region 18 in which the current flows is referred to as a JFET channel. After reaching a certain depth, which is referred to as a spreading depth, the electric field presented by the junction implants 16 begins to diminish. The diminishing electric field allows the current to spread out as it flows further downward through the drift region 14 toward the drain contact 34.

For planar devices like the MOSFET 10P, the gate electrode 30 is necessarily wide and laterally overlaps the source regions 24 such that the channel in the channel region 22 is horizontal. The channel length is represented by the lateral gate length ($LL_G$) identified in FIG. 1. The gate-source overlap (GOL), which is a measure of how much the gate electrode 30 overlaps each of the source regions 24, is also horizontal. As such, the overall gate structure of the MOSFET 10P spreads out laterally and takes up a lot of area, which generally increases cost and runs counter to the ongoing desire to make such devices smaller.

A benefit of planar devices is that the gate dielectric 28 does not have any corners that bend or wrap around the gate electrode. Such bends and corners in the gate dielectric 28 are subject to degrade over time due to the high electrical fields that are generated internally during operation. Such degradation leads to diminished device performance and failure. Further, there is no need for very deep implants to create the shielding regions 20, because the shielding regions 20 are generally relatively shallow.

Figure 2:
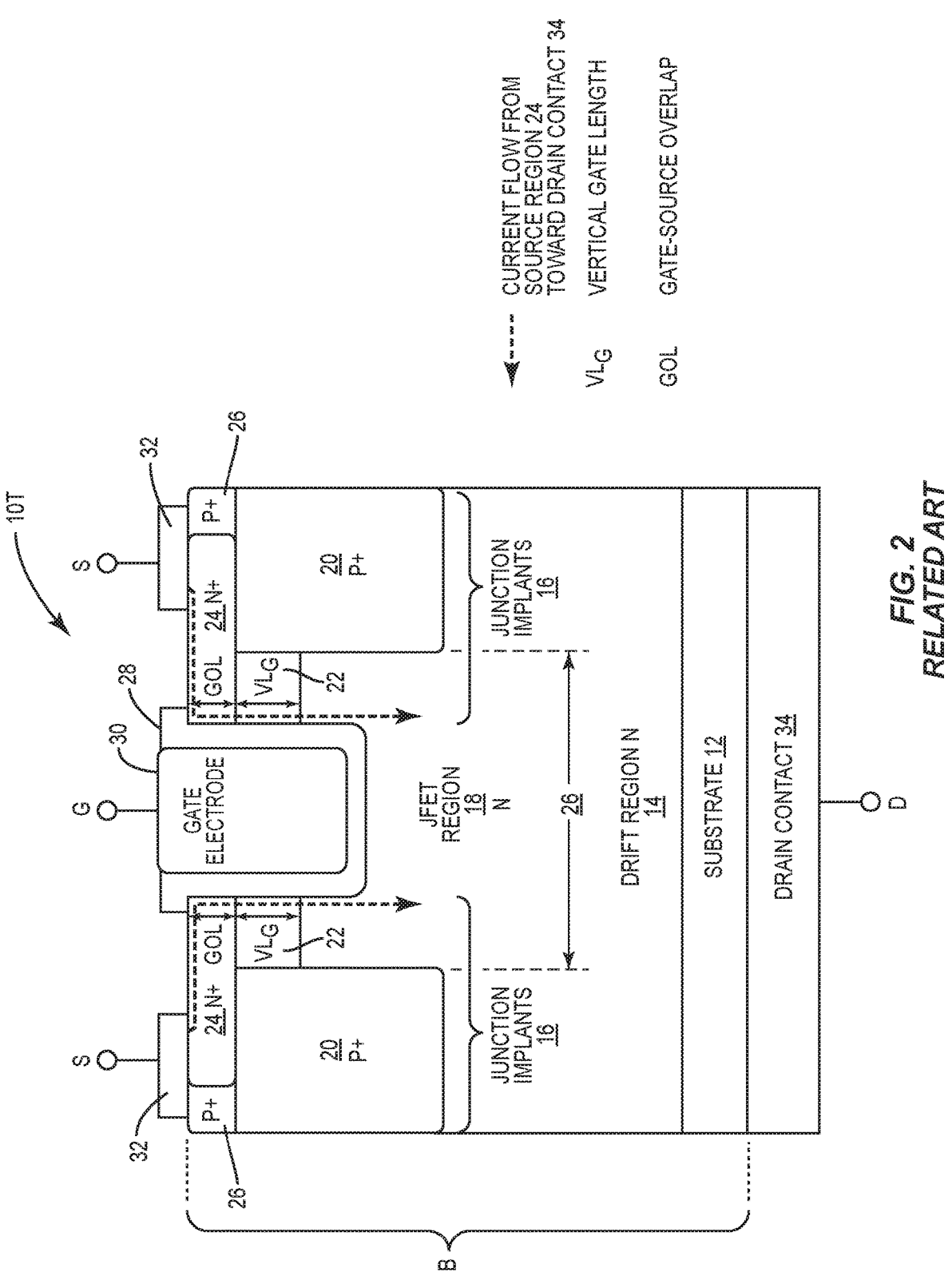
FIG. 2 is a cross-section of a trenched MOSFET that has a planar gate structure, according to related art.

FIG. 2 illustrates another conventional MOSFET configuration, which is referred to as a trenched MOSFET 10T. The primary difference between the planar MOSFET 10P of FIG. 1 and the trenched MOSFET 10T of FIG. 2 is in the configuration of the gate structure. As noted above, the planar MOSFET 10P has a gate dielectric 28 and a gate electrode 30 that are both planar and reside over a top surface of the body B. The trenched MOSFET 10T on the other hand has a gate dielectric 28 and a gate electrode 30 that reside in a "trench," which is recessed into the body B from the top surface of the body B. In this embodiment, the depth of the trench, from the top surface of the body B to the bottom of the trench, typically ranges from 1 um to 2 um.

The source regions 24 are provided on either side of the gate electrode 30 and are separated from the gate electrode 30 by the gate dielectric 28. The channel regions 22 are provided below interior portions of the source regions 24 and between portions of the shielding regions 20 and the gate electrode 30. The gate dielectric 28 insulates the gate electrode 30 from the source regions 24, channel regions 22, shielding regions 20, and the JFET region 18.

In operation, when a biasing voltage is not applied to the gate electrode 30 and the drain contact 34 is positively biased, the P-N junction between each shielding region 20 and the drift region 14 is reverse biased, thereby placing the trenched MOSFET 10T in an OFF state. In the OFF state, any voltage between the source contacts 32 and drain contact 34 is supported by the drift region 14 and only leakage currents will flow between these contacts.

A positive bias is applied to the gate electrode 30 to place the trenched MOSFET 10T in an ON state. In an ON state, a vertical channel is formed in each channel region 22 along the gate dielectric 28 from the corresponding source region 24 to the JFET region 18. Current (shown by dashed lines)

flows vertically through the vertical channels provided in each channel region 22 from the respective source regions 24, via the source contacts 32, into the JFET region 18 of the drift region 14. Once in the JFET region 18, the current flows downward through the drift region 14 toward the drain contact 34.

For a typical trenched layout, both the channel, which is represented by the vertical gate length ($VL_G$), and the gate-source overlap (GOL) are vertical to reduce the width of the gate structure (i.e. pitch) and increase current density. In silicon carbide SiC devices, the vertically oriented channel provides higher electron mobility and therefore affords higher current capability. However, for the trenched devices such as the trenched MOSFET 10T, shielding regions 20 are often greater than one micrometer below the top surface of the body B, much deeper than most implanters can typically reach. The shielding regions 20 are generally deepened relative to a planar device by the depth of the trench for the gate electrode 30 in order to keep the shielding of the JFET region 18 matching the performance of the planar device. Another weakness of a trench device, such as the trenched MOSFET 10T, is that the corners of the gate dielectric 28 in the trench are exposed in the JFET region 18, and as such, are subject to the high electrical fields when blocking current flow. As noted above, the oxide used to form the gate dielectric 28 is prone to fail when exposed to high electrical fields.

Figure 3:
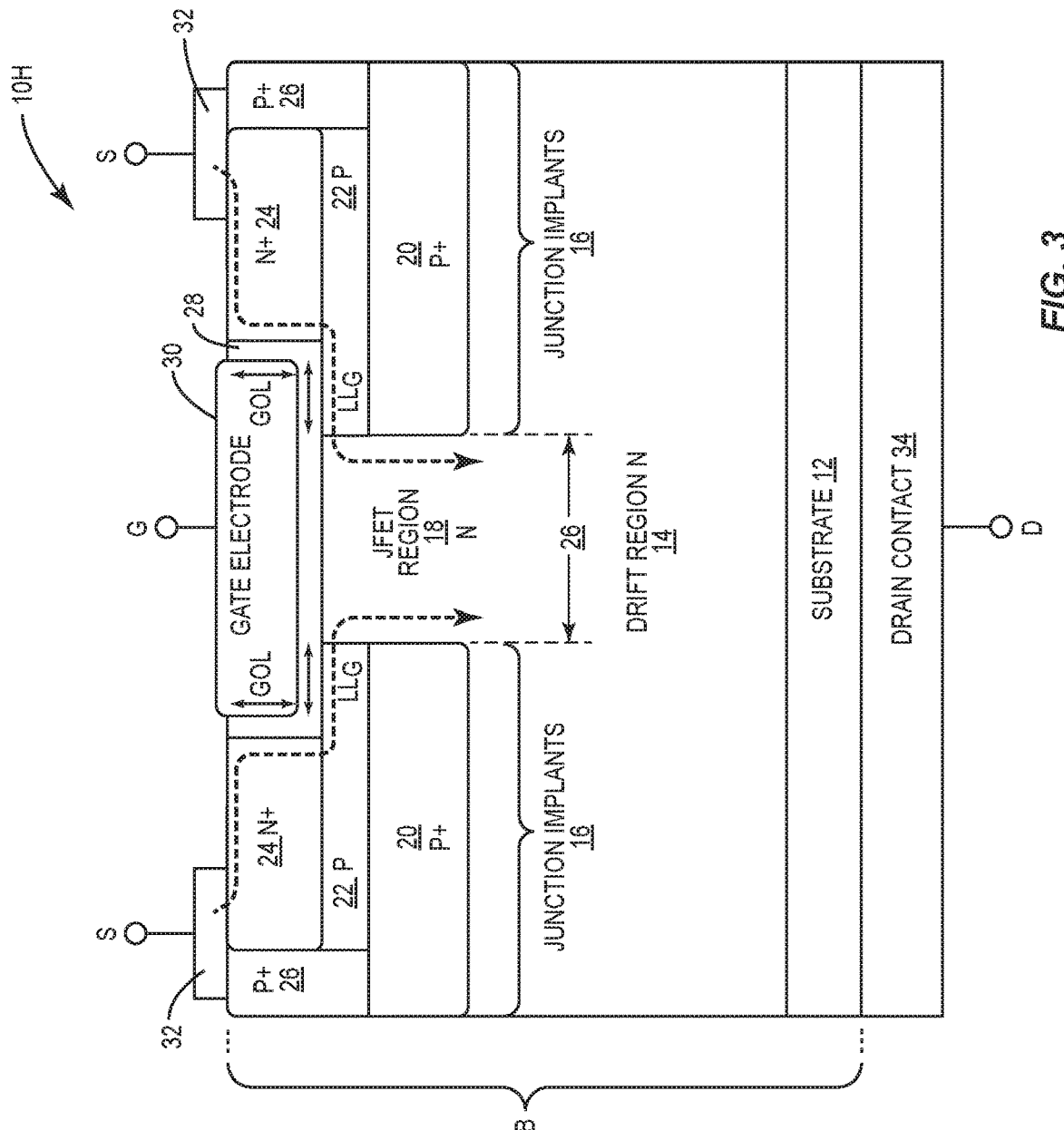
FIG. 3 is a cross-section of a hybrid MOSFET according to a first embodiment of the disclosure.

The following embodiments improve over the above-described planar and trench designs by providing a hybrid gate architecture that employs both a recessed gate structure and channel that has at least a horizontal segment. With reference to FIG. 3, a hybrid MOSFET 10H has a gate dielectric 28 and a gate electrode 30 that reside in a "trench," which is recessed into the drift region 14 from the top surface of the drift region 14. The source regions 24 are provided on either side of the gate electrode 30 and are separated from the gate electrode 30 by the gate dielectric 28. The channel regions 22 are provided below the source regions 24 and extend beneath portions of the gate electrode 30. A first portion of each channel region 22 is below and laterally overlaps a portion of the gate electrode 30, and a second portion of each channel region 22 is below and laterally overlaps at least a portion of the source region 24. For this embodiment, no portion of the channel region 22 vertically overlaps any portion of the gate electrode 30. Again, the gate dielectric 28 insulates the gate electrode 30 from the source regions 24, channel regions 22, shielding regions 20, and the JFET region 18. The depth of the trench from a top surface of the body B to the bottom of the trench ranges from 0.2 micrometers to 1.0 micrometers, 0.2 micrometers to 0.5 micrometers, 0.4 micrometers to 0.8 micrometers, 0.5 um to 1.0 um, and the like. The trench depths are non-limiting.

In operation, when a biasing voltage is not applied to the gate electrode 30 and the drain contact 34 is positively biased, the P-N junction between each shielding region 20 and the drift region 14 is reverse biased, thereby placing the hybrid MOSFET 10H in an OFF state. In the OFF state, any voltage between the source contacts 32 and drain contact 34 is supported by the drift region 14 and only leakage currents will flow between these contacts.

A positive bias is applied to the gate electrode 30 to place the hybrid MOSFET 10H in an ON state. In an ON state, a channel is formed in each channel region 22 for current to flow from the source regions 24 into the JFET region 18. Even though the gate electrode 30 is recessed into the drift region 14, each channel has a horizontal segment in the portion of the channel region 22 that laterally overlaps a portion of the gate electrode 30. As such, current (shown by dashed lines) flows through substantially horizontal channels provided in each channel region 22 from the respective source regions 24, via the source contacts 32, into the JFET region 18 of the drift region 14. Once in the JFET region 18, the current flows downward through the drift region 14 toward the drain contact 34 through the substrate 12. Generally, the current only flows through the channel region 22 where the gate electrode 30 is adjacent the channel region 22.

The shielding regions 20 for this embodiment may laterally overlap all or just a portion of the channel region 22. As illustrated, the shielding regions 20 laterally overlap all of the channel regions 22 and the connector regions 26. Notably, the interior, vertical boundaries of the channel regions 22 and the shielding regions 20 are substantially aligned, and together define the vertical boundaries of the JFET region 18.

For the embodiment of FIG. 3, a relatively shallow trenching between the source regions 24 makes the gate-source overlap (GOL) vertical, thus allowing a smaller device pitch (i.e. smaller width), and thus, higher current density. The shielding regions 20 need to be deeper only by the amount of the shallow trench depth (e.g. approximately 0.2 to 0.4 micrometers more than for a planar device) to keep the same blocking ability. For example, if the trench depth for the gate electrode 30 and the gate dielectric 28 range from 0.2 um to 0.8 um, the depth of the shielding regions 20 will extend into the body from 0.5 to 2 um. As a result, the hybrid MOSFET 10H affords a tighter cell pitch than for a comparable planar device by approximately two times the gate-source overlap (2×GOL), signifying a higher current density for the same layout design rules while not requiring excessively deep shielding regions 20. For certain fabrication processes, it is preferable to have the shielding regions not exceed 1.5 microns from the top surface of the Body B. Also, there are no corners of the gate dielectric exposed to high electrical fields because the existing corners are shielded from the electrical fields in the drift region 14 by the channel regions 22 and shielding regions 20.

Figure 4:
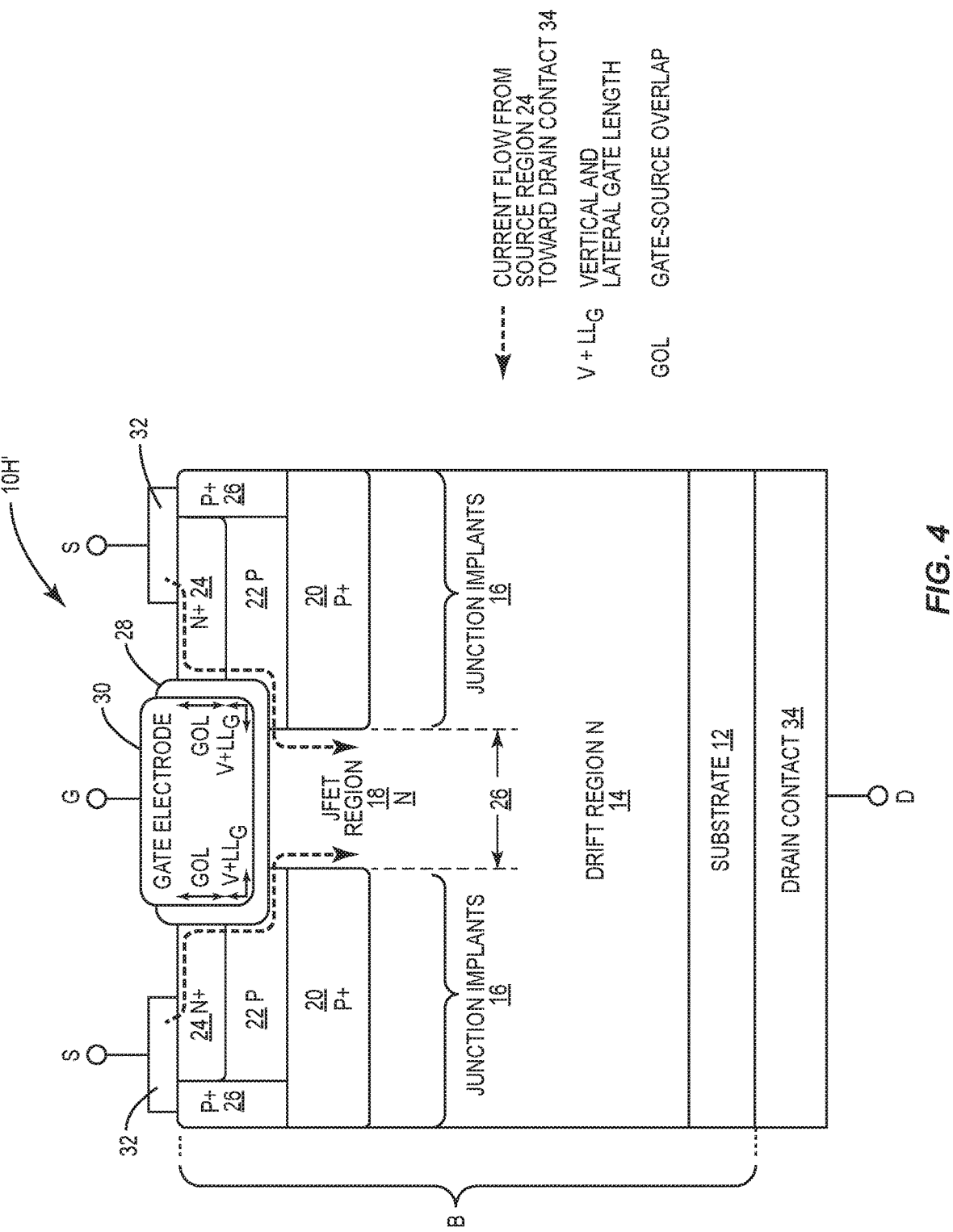
FIG. 4 is a cross-section of a hybrid MOSFET according to a second embodiment of the disclosure.

A second embodiment for a hybrid MOSFET 10H' is illustrated in FIG. 4. The hybrid MOSFET 10H' also has a gate dielectric 28 and a gate electrode 30 that reside in a "trench," which is recessed into the drift region 14 from the top surface of the drift region 14. The source regions 24 are provided on either side of the gate electrode 30 and are separated from the gate electrode 30 by the gate dielectric 28. The difference between the hybrid MOSFET 10H of FIG. 3 and the hybrid MOSFET 10H' of FIG. 4 resides primarily in the configuration of the channel regions 22 relative to gate electrode 30.

The channel regions 22 are provided below the source regions 24 and extend beneath portions of the gate electrode 30 such that:

a first portion of each channel region 22 is below and laterally overlaps a portion of the gate electrode 30;

a second portion of each channel region is below and laterally overlaps at least a portion of the source region 24; and the second portion of each channel region 22 is beside and vertically overlaps a portion of the gate electrode 30.

The configuration illustrated in FIG. 4 provides a channel with both vertical and horizontal segments in each of the channel regions 22, when the MOSFET 10H' is in an ON state. The horizontal segment of each channel resides in the first portion of each channel region 22 that laterally overlaps a portion of the gate electrode 30. The vertical segment of each channel resides in the second portion of each channel region 22 that vertically overlaps a portion of the gate electrode 30. As such, current will flow (shown by dashed lines) from the source regions 24 into the JFET region 18 through the corresponding channel regions 22. When flowing through the channel regions 22, the current will flow downward from the source regions 24 along the vertical segments of the channels in the portions of the channel regions 22 that vertically overlap the gate electrode 30, and then horizontally through the horizontal segments of the channels in the portions of the channel regions 22 that laterally overlap the gate electrode 30. Once in the JFET region 18, the current flows downward through the drift region 14 towards the drain contact 34 through the substrate 12. As illustrated, the current generally only flows through the channel region 22 where the gate electrode 30 is adjacent the channel region 22.

When a biasing voltage is not applied to the gate electrode 30 and the drain contact 34 is positively biased, the P-N junction between each shielding region 20 and the drift region 14 is reverse biased, thereby placing the hybrid MOSFET 10H' in an OFF state. In the OFF state, any voltage between the source contacts 32 and drain contact 34 is supported by the drift region 14 and only leakage currents will flow between these contacts.

The shielding regions 20 may laterally overlap all or just a portion of the channel region 22. For the embodiment of FIG. 4, the shielding regions 20 laterally overlap most or all of the channel regions 22. As such, portions of the shielding regions 22 overlap portions of the gate electrode 30, albeit with portions of the channel regions 22 residing between the gate electrode 30 and the shielding regions 20. Notably, the interior vertical boundaries of the channel regions 22 and the shielding regions 20 are substantially aligned and together define the vertical boundaries of the JFET region 18. The interior boundaries of the channel regions 22 and the shielding regions 20 do not need to be aligned or vertical.

The embodiment of FIG. 4 provides a slightly deeper trench for the gate electrode 30 and the gate dielectric 28. For example, the trench may range from 0.3 to 1.3 micrometers. A slightly deeper trenching of this area between the source regions 24, compared to the embodiment FIG. 3, extends the vertical gate-source overlap (GOL). Further, the channel has a vertical portion and a horizontal portion, wherein the channel has an overall gate length represented as $V+LL_G$ (i.e. vertical and lateral components) and highlighted in FIG. 4. The result is an even smaller device pitch and even higher current density for the hybrid MOSFET 10H' of FIG. 4. The vertical channel in SiC (0001) will have a higher electron mobility as well. The shielding regions 20 need to be deeper than for a planar device by the amount of the trench depth (e.g. approximately 0.3 to 0.6 micrometers more than for a planar device) to keep the same blocking ability. The trench depth for the gate electrode 30 and the gate dielectric 28 may range from 0.3 to 1.3 micrometers, 0.5 to 1.1 micrometers, 0.7 to 1.0 micrometers, and the like, In certain non-limiting embodiments, the depth of the shielding regions 20 may extend from 0.6 to 2 micrometers, 0.9 to 1.7 micrometers, or 1.1 to 1.4 micrometers.

Figure 5:
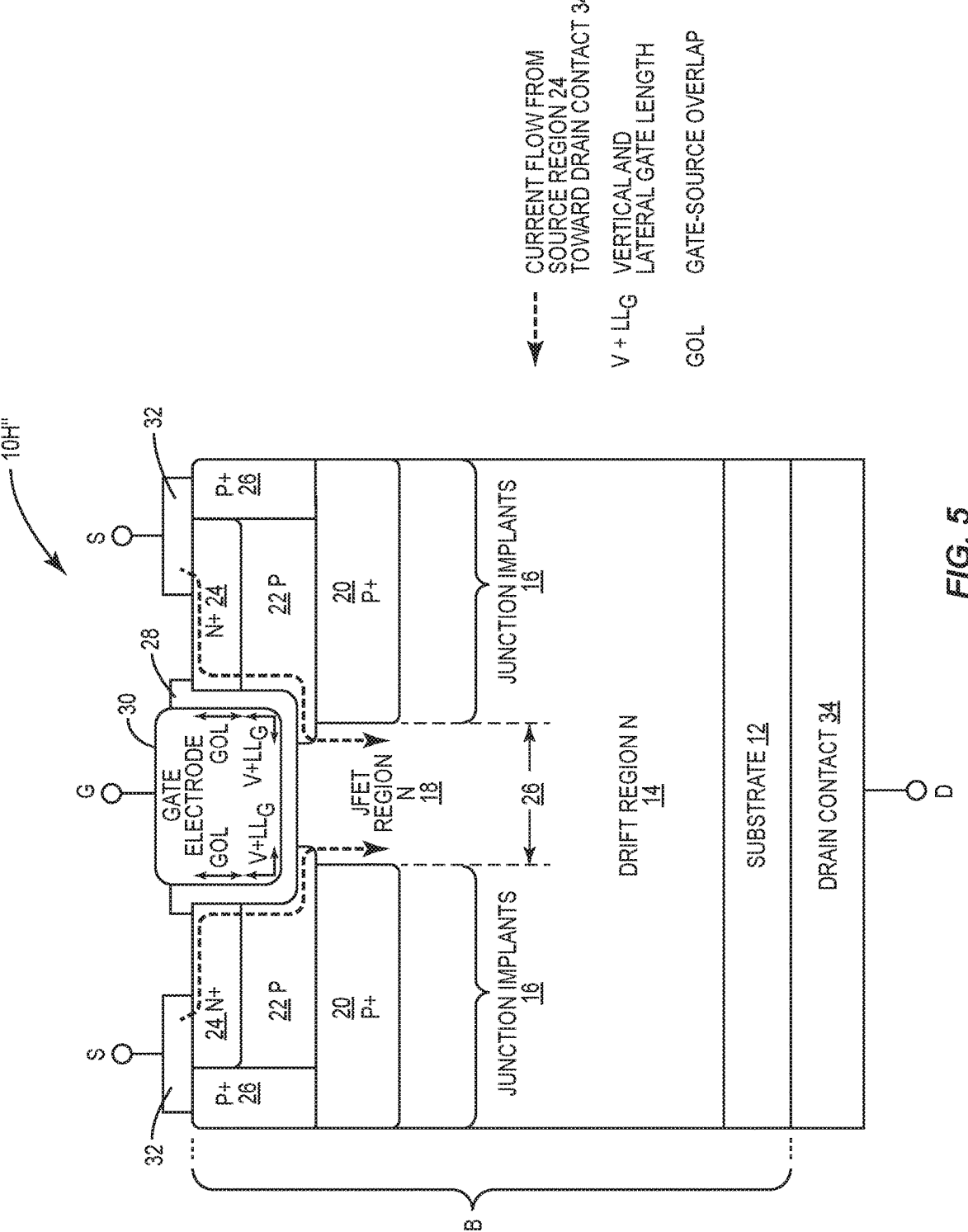
FIG. 5 is a cross-section of a hybrid MOSFET according to a third embodiment of the disclosure.

FIG. 5 illustrates another embodiment of a hybrid MOSFET 10H". In this embodiment, the interior side walls of the shielding regions 20 are recessed back from the interior side walls of the channel regions 22, such that the portion of the JFET region 18 between the channel regions 22 is narrower than the portion of the JFET region 18 between the shielding regions 20. There is a slight pitch tightening compared to the embodiment of FIG. 4, thereby providing similar or improved shielding and even higher current density. These interior sidewalls for the channel regions 22 and the shielding regions 20 may be substantially vertical or angled. The orientation of the sidewalls and the extent of overlap with respect to each other and the gate electrode 30 will vary based on the desired performance characteristics, size, cost, and the like. In another embodiment, the shielding regions 20 extend laterally inward past the interior side walls of the channel regions 22.

The concepts described herein are not limited to, but are particularly beneficial to, MOSFETs and other insulated-gate devices, such as insulated gate bipolar transistors. Notably, the terms source, gate and drain as used herein are deemed to respectively include emitter, base, and collector, and as such, the claims that follow are intended to cover all such insulated-gate devices, regardless of how each region or contact is labeled.

Those skilled in the art will recognize improvements and modifications to the preferred embodiments of the present disclosure. All such improvements and modifications are considered within the scope of the concepts disclosed herein and the claims that follow.

What is claimed is:

1. A vertical field effect device comprising:
a body comprising:
a first source region and a second source region that extend into the body;
a first channel region below and laterally overlapping the first source region, the first channel region forming a first channel with a first horizontal segment that is below the first source region, and a second channel region below and laterally overlapping the second source region, the second channel region forming a second channel with a second horizontal segment that is below the second source region;
a JFET region;
a first shielding region below and laterally overlapping the first channel region, where the first shielding region directly contacts the first channel region and has a higher doping concentration than the first channel region, and a second shielding region below and laterally overlapping the second channel region, where the second shielding region directly contacts the second channel region and has a higher doping concentration than the second channel region;
a gate electrode in a trench that extends into the body and is located between the first source region and the second source region, wherein the JFET region is under the gate electrode; and
a gate dielectric between and isolating the gate electrode from the body,
wherein the first source region and the second source region vertically overlap with the gate electrode,
wherein the first channel region and the second channel region laterally overlap with a bottom of the gate electrode, and
wherein the first and second channel regions do not vertically overlap the gate electrode,
wherein the first channel region directly contacts the first source region and the second channel region directly contacts the second source region.

2. The vertical field effect device of claim 1 wherein the first and second horizontal segments laterally overlap the bottom of the gate electrode.

3. The vertical field effect device of claim 2 wherein the JFET region further resides between the first shielding region and the second shielding region.

4. The vertical field effect device of claim 3 wherein the first and second channel regions are closer to one another than the first and second shielding regions, such that a portion of the JFET region between the first and second channel regions is narrower than a portion of the JFET region between the first and second shielding regions.

5. The vertical field effect device of claim 1 wherein no portion of the gate electrode laterally overlaps the first and second source regions.

6. The vertical field effect device of claim 1 wherein the first and second source regions are doped with an N-type material, and the first and second channel regions are doped with a P-type material.

7. The vertical field effect device of claim 1 wherein the field effect device is an insulated gate bipolar transistor.

8. The vertical field effect device of claim 1 wherein the body comprises silicon carbide.

9. The vertical field effect device of claim 1 wherein the body comprises a substrate, a drift region over the substrate, and a drain contact below the substrate, such that the JFET region is formed in an upper portion of the body above the drift region.

10. The vertical field effect device of claim 1 wherein the trench has a depth, as measured from a top surface of the body to a bottom of the trench, between 0.2 um and 0.8 um.

11. The vertical field effect device of claim 10 wherein the first and second shielding regions are less than two micrometers deeper than the bottom of the trench.

12. The vertical field effect device of claim 1 wherein the field effect device is configured to block at least 300 volts in an off-state and conduct at least 1 ampere in an on-state.

13. A vertical field effect device comprising:
a body comprising:
a first source region and a second source region that extend into the body;
a first channel region below and laterally overlapping the first source region, the first channel region forming a first channel with a first horizontal segment that is below the first source region, and a second channel region below and laterally overlapping the second source region, the second channel region forming a second channel with a second horizontal segment that is below the second source region;
a JFET region; and
a first shielding region below and laterally overlapping the first channel region, and
a second shielding region below and laterally overlapping the second channel region;
a gate electrode in a trench that extends into the body and is located laterally between the first source region and the second source region, wherein the JFET region is under the gate electrode; and
a gate dielectric between and isolating the gate electrode from the body, wherein:
the first source region and the second source region vertically overlap the gate electrode,
the first channel region and the second channel region laterally overlap a bottom of the gate electrode, and
a width of a first portion of the JFET region that is between the first channel region and the second channel region is less than a width of a second portion of the JFET region that is between the first shielding region and the second shielding region.

14. The vertical field effect device of claim 13 wherein:

the first and second channels are formed in the first and second channel regions and where the first and second channel regions laterally overlap the bottom of the gate electrode; and the first and second channels formed in the first and second channel regions each further have a respective vertical segment where the first and second channel regions vertically overlap the gate electrode.

15. The vertical field effect device of claim 14 wherein the trench has a depth, as measured from a top surface of the body to a bottom of the trench, between 0.3 um and 1.3 um.

16. The vertical field effect device of claim 15 wherein the first and second shielding regions are less than two micrometers deeper than the bottom of the trench.

17. The vertical field effect device of claim 14 wherein the field effect device is an insulated gate bipolar transistor.

18. The vertical field effect device of claim 14, wherein the first and second channel regions vertically overlap sides of the gate electrode.

19. The vertical field effect device of claim 13 wherein the body comprises silicon carbide.

20. A vertical field effect device comprising:
a body comprising:
    a first source region and a second source region;
    a first channel region below and laterally overlapping the first source region, the first channel region forming a first channel with a first horizontal segment that is at least partially below the first source region, and
    a second channel region below and laterally overlapping the second source region, the second channel region forming a second channel with a second horizontal segment that is at least partially below the second source region;
a JFET region; and
a gate electrode in a trench that extends into the body and is located between the first source region and the second source region, the JFET region under the gate electrode;
wherein the first source region and the second source region vertically overlap with the gate electrode,
wherein the first channel region and the second channel region laterally overlap with a bottom of the gate electrode, and
wherein the first source region and the second source region each extend farther vertically into the body than does the gate electrode.

21. The vertical field effect device of claim 20, further comprising:
a first shielding region below and laterally overlapping the first channel region, and
a second shielding region below and laterally overlapping the second channel region.

22. The vertical field effect device of claim 21 wherein the first shielding region directly contacts the first channel region and has a higher doping concentration than the first channel region, and the second shielding region directly contacts the second channel region and has a higher doping concentration than the second channel region.

* * * * *